(12) United States Patent
Chang et al.

(10) Patent No.: US 9,627,316 B1
(45) Date of Patent: Apr. 18, 2017

(54) FIELD EFFECT TRANSISTOR DEVICES HAVING INTERCONNECT STRUCTURES AND MANUFACTURING METHOD THEREOF

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/968,921

(22) Filed: Dec. 15, 2015

(51) Int. Cl.
*H01L 21/768* (2006.01)
*H01L 23/528* (2006.01)
*H01L 23/532* (2006.01)
*H01L 23/522* (2006.01)
*H01L 29/423* (2006.01)
*H01L 21/02* (2006.01)
*H01L 23/538* (2006.01)
*H01L 23/482* (2006.01)

(52) U.S. Cl.
CPC ........ *H01L 23/528* (2013.01); *H01L 21/0214* (2013.01); *H01L 21/0217* (2013.01); *H01L 21/0228* (2013.01); *H01L 21/02167* (2013.01); *H01L 21/02183* (2013.01); *H01L 21/02186* (2013.01); *H01L 21/02274* (2013.01); *H01L 21/7684* (2013.01); *H01L 21/76804* (2013.01); *H01L 21/76814* (2013.01); *H01L 21/76832* (2013.01); *H01L 21/76879* (2013.01); *H01L 23/4821* (2013.01); *H01L 23/5226* (2013.01); *H01L 23/5381* (2013.01); *H01L 23/53233* (2013.01); *H01L 23/53238* (2013.01); *H01L 23/53295* (2013.01); *H01L 29/4232* (2013.01)

(58) Field of Classification Search
CPC ........ H01L 21/76807; H01L 21/76814; H01L 21/7682; H01L 21/76826; H01L 21/76831; H01L 2924/0002; H01L 21/76834; H01L 21/76843; H01L 21/76867; H01L 23/5222; H01L 23/53295; H01L 21/76864; H01L 21/76873; H01L 21/76802; H01L 21/76835; H01L 23/53238; H01L 23/5329
See application file for complete search history.

(56) References Cited

U.S. PATENT DOCUMENTS

2008/0182405 A1* 7/2008 Liu .................. H01L 21/76807
438/623

* cited by examiner

*Primary Examiner* — Thanh T Nguyen
(74) *Attorney, Agent, or Firm* — Jianq Chyun IP Office

(57) ABSTRACT

A field effect transistor comprising a substrate, at least one gate stack structure, source and drain regions and an interconnect structure is described. The interconnect structure comprises a metal interconnect connected to a conductive region, an adhesion sheath structure and a cap layer. The adhesion sheath structure is disposed between the metal interconnect and inter-dielectric layers and surrounds the metal interconnect. The cap layer is disposed on the metal interconnect and covers a gap between the metal interconnect and the inter-dielectric layer.

20 Claims, 8 Drawing Sheets

FIELD EFFECT TRANSISTOR DEVICES HAVING INTERCONNECT STRUCTURES AND MANUFACTURING METHOD THEREOF

BACKGROUND

As the linewidth of the semiconductor devices keeps scaling down, the gate width and the channel length of the CMOS-compatible semiconductor devices, including planar metal-oxide-semiconductor field effect transistors (FETs) and non-planar fin-type field effect transistors (FinFETs), keep shrinking. For the semiconductor devices of high integration and tight design rules, the formation of metal contacts or interconnects is challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
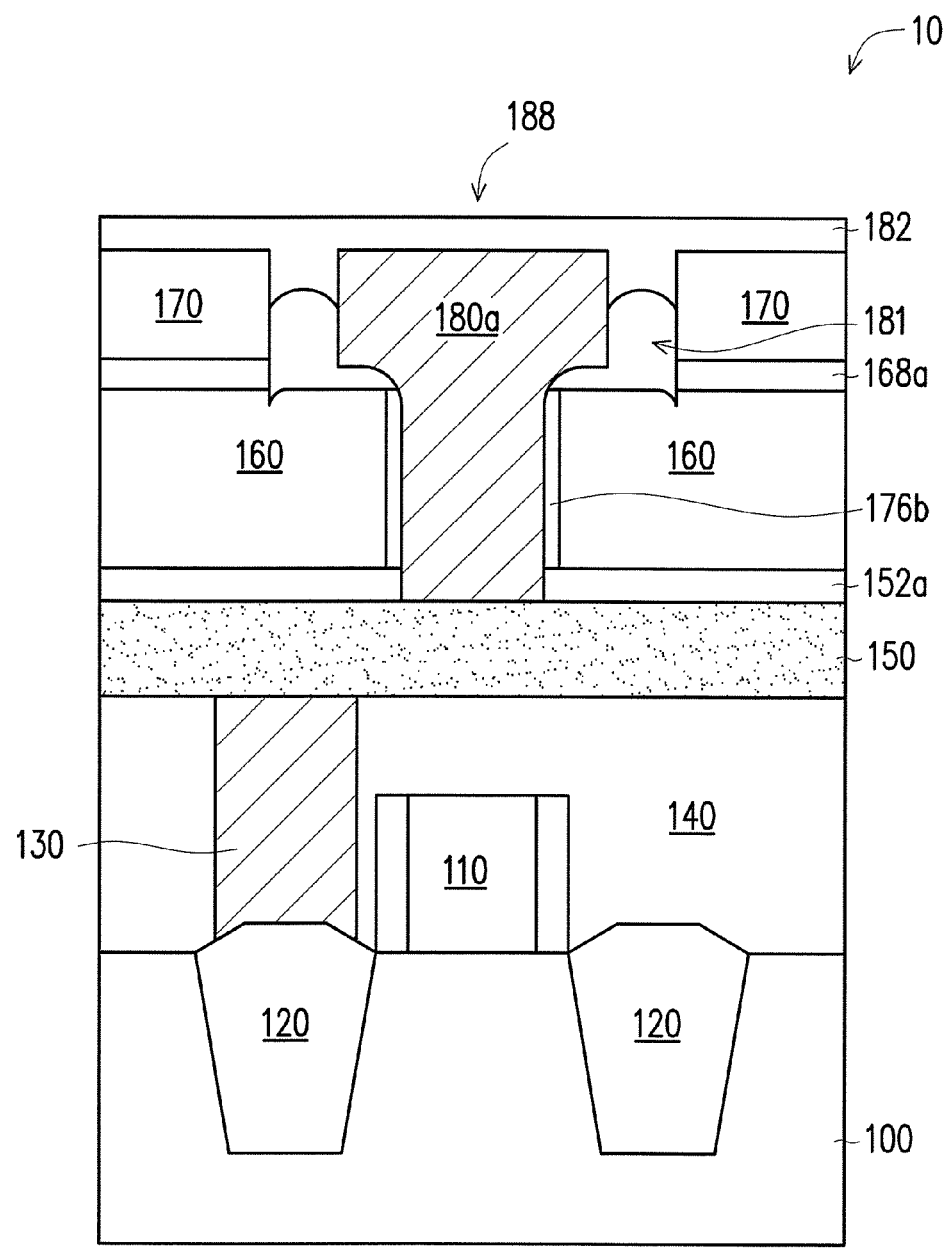
FIG. 1 illustrates a cross-sectional view of an exemplary FET device in accordance with some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FETs and the FET devices fabricated there-from. The FET may be formed on a monocrystalline semiconductor substrate, such as a bulk silicon substrate in certain embodiments of the present disclosure. In some embodiments, the FET may be formed on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

FIG. 1 illustrates a cross-sectional view of an exemplary FET device in accordance with some embodiments of the present disclosure. In FIG. 1, in certain embodiments, the FET device 10 comprises at least one gate stack structure 110 formed on a substrate 100 and source and drain regions 120 located within the substrate 100 and at two opposite sides of the gate stack structure 110. In some embodiments, the FET device 10 also comprises a dielectric layer 140 located above and covering the gate stack structure 110, the source and drain regions 120 and at least one connector 130 electrically connected to the source and drain regions 120. In some embodiments, the FET device is a FinFET device, the gate stack structure 110 includes a polysilicon gate structure or a replacement metal gate structure, and the source and drain regions 120 are strained source and drain regions. The dielectric layer 140 comprises one or more dielectric layers or inter-dielectric layers, for example. In some embodiments, the FET device 10 comprises a conductive region 150 located above the dielectric layer 140 and an interconnect structure 188 connected to the conductive region 150. In certain embodiments, the conductive region 150 is electrically connected to the underlying connector 130 or further connecting structures and/or dielectric layer (not shown) may be included between the conductive region 150 and the connector 130. Alternatively, in some embodiments, the conductive region 150 is not electrically connected to the connector 130 or the interconnect structure 188 is electrically floating. The interconnect structure 188 of the FET device 10 is intended to be located above the gate stack structure 110 for interconnection.

FIG. 2A-2L illustrates a portion of an exemplary FinFET device at various stages of the manufacturing methods for forming a FinFET device according to some embodiments of the present disclosure. In the following embodiments, the FinFET device 12 is described as an example but is not intended to limit the scope of the present disclosure, and the described portion of the device is mainly directed to the portion with at least one interconnect structure above the conductive region.

Figure 2A:
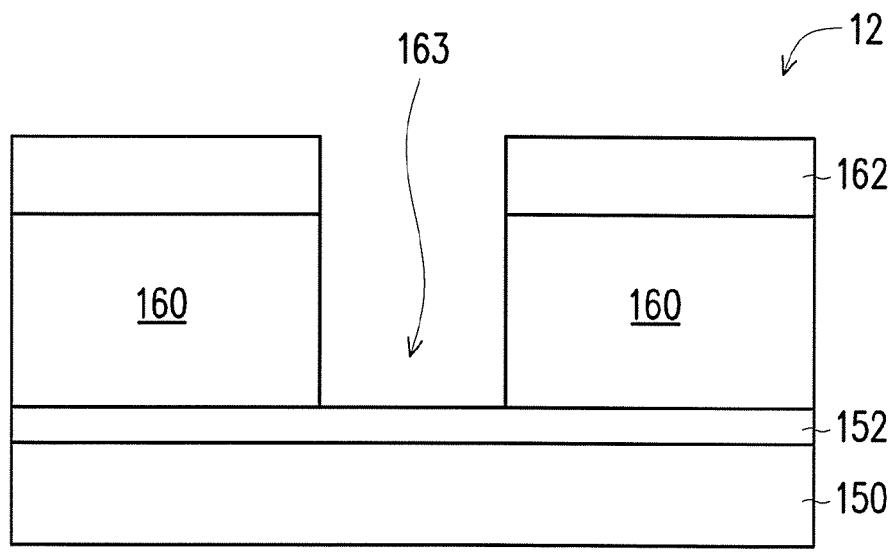
FIGS. 2A-2L are the cross-sectional views showing a portion of an exemplary FinFET device at various stages of the manufacturing method for forming a FinFET device according to some embodiments of the present disclosure.

In FIG. 1 and FIG. 2A, in certain embodiments, a substrate 100 with at least one gate stack structure 110 thereon and source and drain regions 120 at two opposite sides of the gate stack structure 110 is provided. Also, at least one connector 130 connected to the source and drain regions 120, a dielectric layer 140 located above and covering the gate stack structure 110, the source and drain regions 120 and the connector 130 and a conductive region 150 located above the dielectric layer 140 are provided. In some embodiments, the substrate 100 is a monocrystalline silicon semiconductor substrate or a SOI substrate, for example. The gate structure(s) 110, the source and drain regions 120, the connector 130 and the dielectric layer 140 shown in FIG. 1 are for illustrative purposes but not intended to limit the structure of the present disclosure.

Referring to FIG. 2A, a conductive region 150 over the substrate 100 is provided. In some embodiments, the conductive region 150 includes a contact terminal or a metal line. For example, the conductive region 150 may be electrically connected to the underlying source and drain regions 120 (FIG. 1) or electrically connected to the gate electrode of the gate stack structure. In some embodiments, a liner layer 152, a first inter-dielectric layer 160 and a first resist pattern 162 are sequentially formed on the conductive region 150 and over the dielectric layer 140. In some embodiments, the material of the liner layer 152 includes silicon carbide (SiC), silicon carbonitride (SiCN) or other suitable dielectric materials. In some embodiments, the liner layer 152 is formed by chemical vapor deposition (CVD), for example. In certain embodiments, the first inter-dielectric layer 160 having at least one via opening 163 is formed by etching the first inter-dielectric layer 160 using the first resist pattern 162 as a mask. The first resist pattern 162 includes a via-hole pattern for defining the via opening 163 of the first inter-dielectric layer 160. In some embodiments, the patterning of the first inter-dielectric layer 160 (i.e. the formation of the via opening 163) includes performing one or more etching processes, including anisotropic etching, reactive ion etching (RIE), isotropic etching processes or the combination thereof. In some embodiments, the formation of the via opening 163 includes etching the first inter-dielectric layer 160 to expose the liner layer 152 and to form the via opening 163 with a substantially vertical etch profile. In some embodiments, the first inter-dielectric layer 160 is patterned to expose the liner layer 152. The process window for forming the via opening becomes larger due to the existence of the liner layer 152. In certain embodiments, the first inter-dielectric layer 160 includes at least one dielectric material selected from silicon oxide, silicon nitride, SiC, silicon carbonitride (SiCN) or a low-k dielectric material. The low-k dielectric material has a k value lower than about 4.0 and includes carbon-containing oxides or silicate glass formed by low-pressure chemical vapor deposition (LPCVD), plasma-enhanced chemical vapor deposition (PECVD) and spin-on method(s), for example. In one embodiment, the materials of the first inter-dielectric layer 160 and the liner layer 152 are chosen to be different for suitable etching selectivity.

Figure 2B:
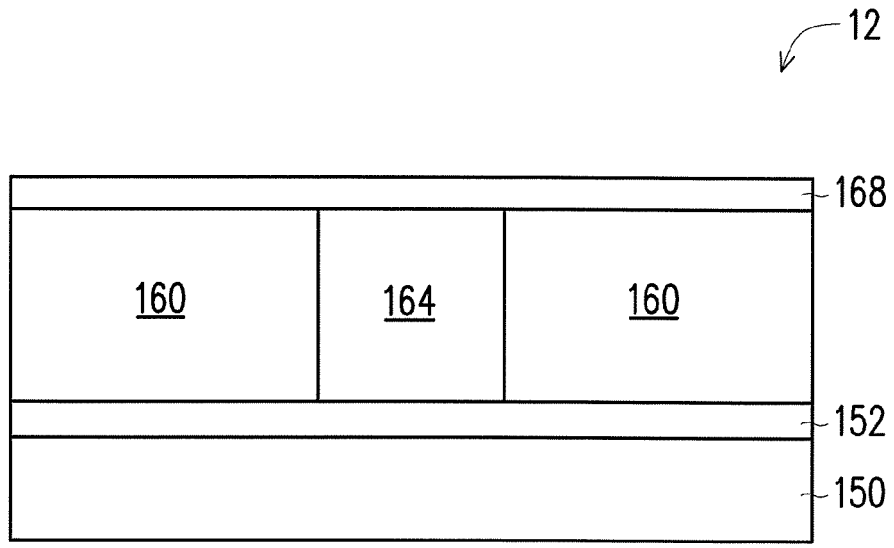

In FIG. 2B, in some embodiments, a filling material 164 is formed with in the via opening 163 and fills up the via opening 163. Later, in some embodiments, a stop layer 168 is formed on the first inter-dielectric layer 160 and covering the filling material 164. In one embodiment, the filling material 164 is obtained by forming a gap-filling material (not shown) covering the first inter-dielectric layer 160 and filling up the via opening 163 and then the extra gap-filling material is removed along with the first resist pattern 162 by etching-back. In some embodiments, the material of the stop layer 168 includes silicon nitride, silicon oxynitride, silicon carbonitride (SiCN), silicon carbon oxide (SiCO), silicon carbide (SiC), silicon carbon oxynitride (SiCON) or the combination thereof. In some embodiments, the stop layer 168 is formed by thermal oxidation, LPCVD, reduced pressure chemical vapor deposition (RPCVD) or a combination thereof. The thickness of the stop layer 168 may be adjusted depending on the requirements of the etching process or the product design.

Figure 2C:
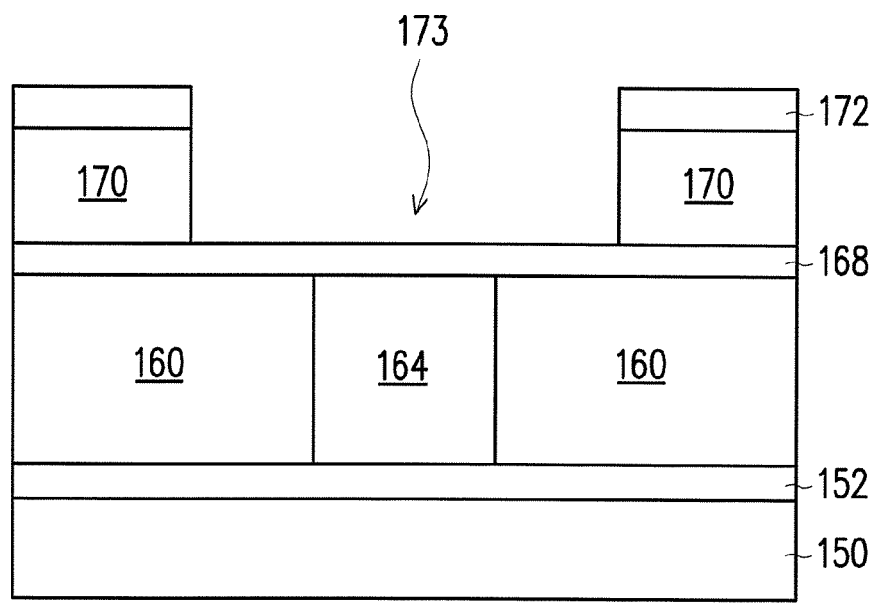

In FIG. 2C, in some embodiments, a second inter-dielectric layer 170 and a second resist pattern 172 are sequentially formed on the stop layer 168 and the first inter-dielectric layer 160. In certain embodiments, the second inter-dielectric layer 170 having at least one trench opening 173 is formed by etching the second inter-dielectric layer 170 using the second resist pattern 172 as a mask. The second resist pattern 172 includes a trench-hole pattern for defining the trench opening 173 of the second inter-dielectric layer 170. In some embodiments, the second inter-dielectric layer 170 is patterned to expose the stop layer 168. In some embodiments, the patterning of the second inter-dielectric layer 170 (i.e. the formation of the trench opening 173) includes performing one or more etching processes, including anisotropic etching, reactive ion etching (RIE), isotropic etching processes or the combination thereof. In some embodiments, the formation of the trench opening 173 includes etching the second inter-dielectric layer 170 to expose the stop layer 168 and to form the trench opening 173 with a substantially vertical etch profile. The process window for forming the trench opening becomes larger due to the existence of the stop layer 168. In certain embodiment, the second inter-dielectric layer 170 includes at least one dielectric material selected from silicon oxide, silicon nitride, SiC, silicon carbonitride (SiCN) or a low-k dielectric material. The low-k dielectric material has a k value lower than about 4.0 and includes carbon-containing oxides or silicate glass formed by LPCVD, PECVD and spin-on method(s), for example. In one embodiment, the materials of the second inter-dielectric layer 170 and the stop layer 168 are chosen to be different for suitable etching selectivity. In one embodiment, the materials of the second inter-dielectric layer 170 and the first inter-dielectric layer 160 are the same or different. In certain embodiments, the first and second inter-dielectric layers 160, 170 and the stop layer 168 sandwiched in-between may be regard as one inter-dielectric layer with a stop layer embedded therein.

Figure 2D:
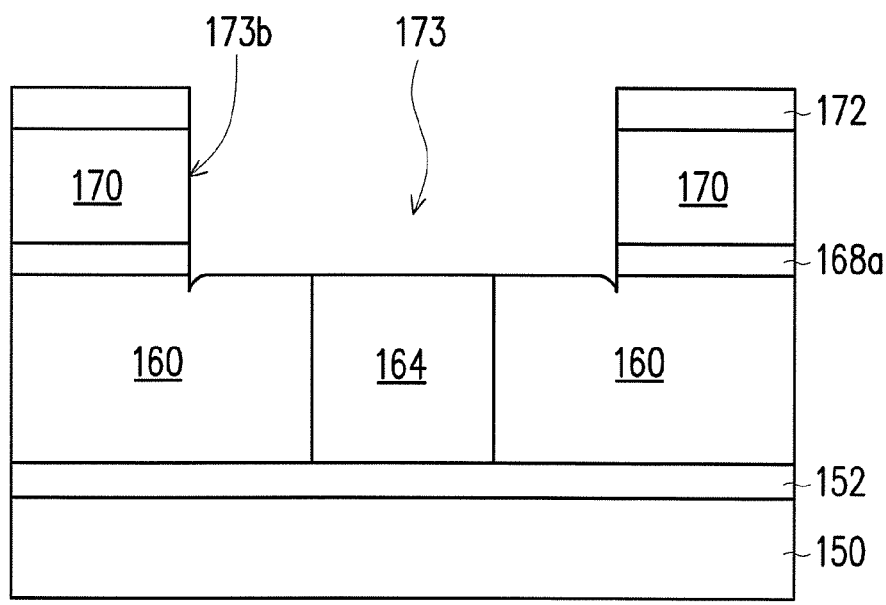

In FIG. 2D, in certain embodiments, the stop layer 168 exposed by the trench opening 173 is removed and the remained stop layer 168a is located beneath the second inter-dielectric layer 170, so that a portion of the first inter-dielectric layer 160 and the filling material 164 are exposed. In some embodiments, the stop layer 168 is removed by performing one or more etching processes, including anisotropic etching, RIE, isotropic etching or the combination thereof. In one embodiment, depending on the choice of the materials for the first inter-dielectric layer 160 and the stop layer 168, it is intended that the etching selectivity of the etching process is controlled so as to remove the exposed stop layer 168 without damaging the underlying first inter-dielectric layer 160. The process window for the etching of the stop layer 168 is small and over-etching sometimes occurs to the first inter-dielectric layer 160. Although the etch selectivity is adjusted and controlled, the minor encroachment into the first inter-dielectric layer 160 near the edge(s) of the trench opening 173 may occur during the etching of the stop layer 168.

Figure 2E:
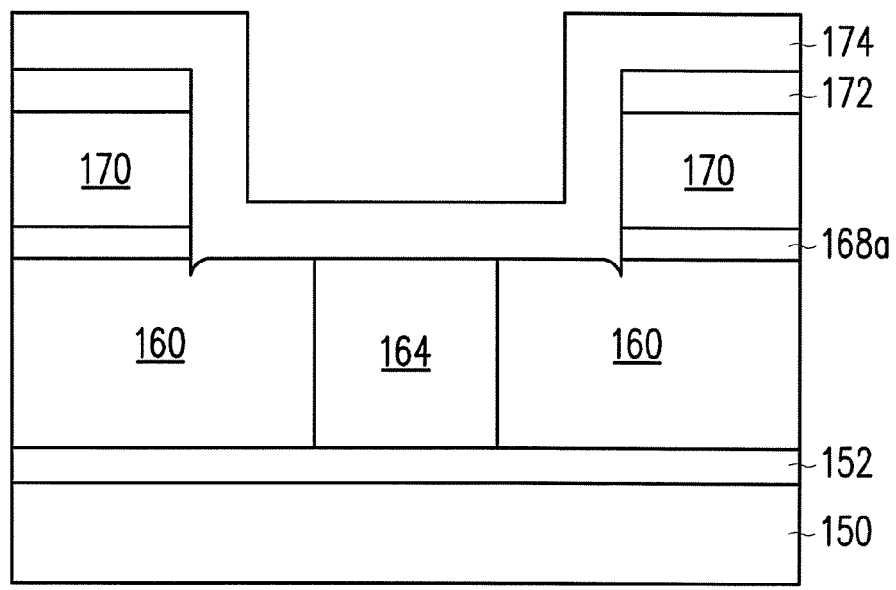

As shown in FIG. 2E, in some embodiments, a conformal barrier layer 174 is formed on the second resist pattern 172 and the second inter-dielectric layer 170 and over the trench opening 173, conformally covering sidewalls 173b of the trench opening 173 and the first inter-dielectric layer 160 and the filling material 164 exposed by the trench opening 173. In one embodiment, a material of the barrier layer 174 comprises silicon nitride, silicon oxynitride, SiCN or a combination thereof. In one embodiment, the barrier layer 174 is formed with good conformity and the barrier layer 174 is formed by atomic layer deposition (ALD). In certain embodiments, the barrier layer 174 is conformal to the profile of the trench opening 173 and covers possibly occurred minor encroachment into the first inter-dielectric layer 160 near the edge(s) of the trench opening 173. By forming such conformal barrier layer 174, the encroachment is covered and isolated from the subsequently formed interconnect plug, thus suppressing the formation of tiger teeth beneath the trench or via bottom.

Figure 2F:
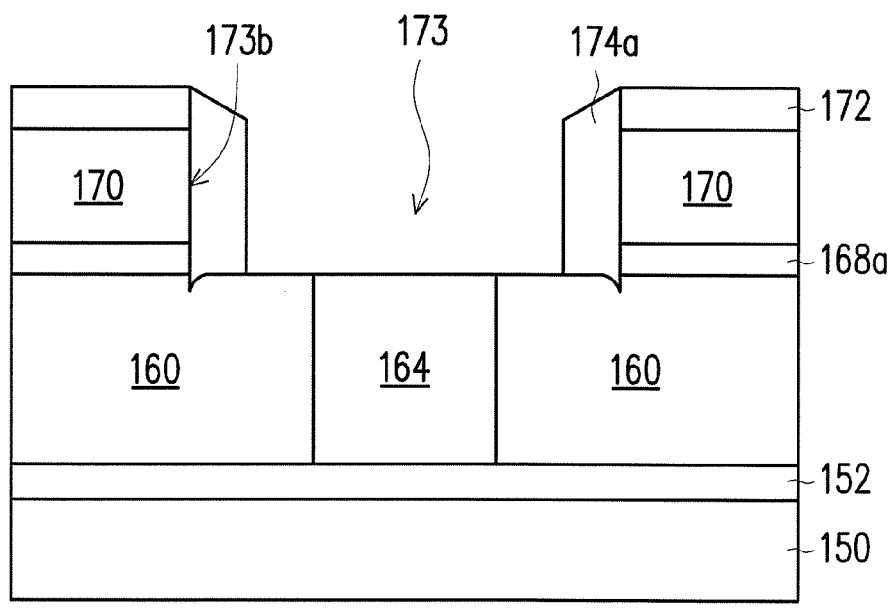

In FIG. 2F, in some embodiments, the barrier layer 174 is partially removed and the remained barrier layer 174a, as the sidewall barrier, is remained on the sidewalls 173b of the trench opening 173. In certain embodiments, the barrier layer 174 is partially removed by performing an anisotropic etching process to expose the bottom of the trench opening 173 as well as the first inter-dielectric layer 160 and the filling material 164, and the remained barrier layer 174a covers the sidewalls 173b of the trench opening 173 and the encroachment if occurred.

Figure 2G:
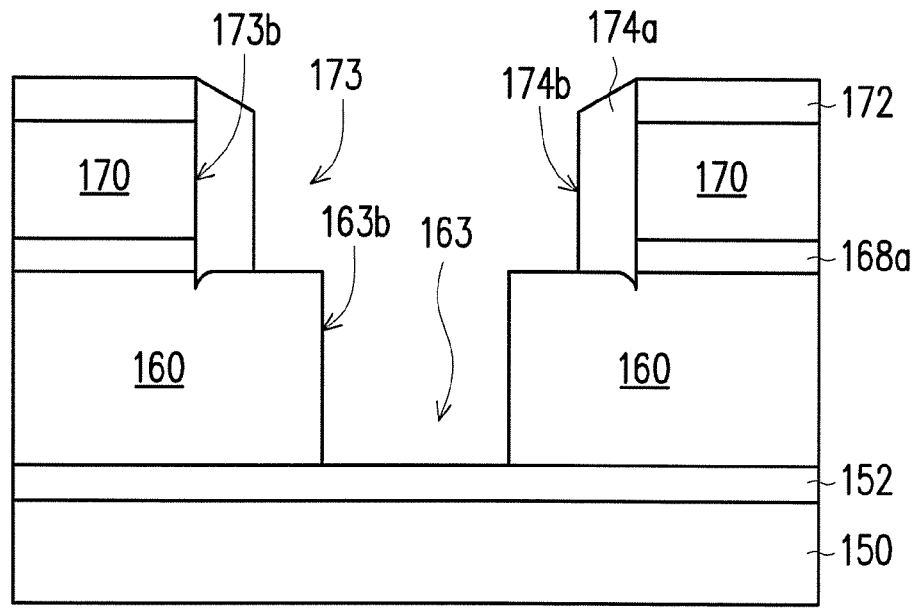

In FIG. 2G, in some embodiments, the filling material 164 is removed and the liner layer 152 and the via opening 163 are exposed. In some embodiments, the filling material 164 is removed by performing an anisotropic etching or isotropic etching process.

Figure 2H:
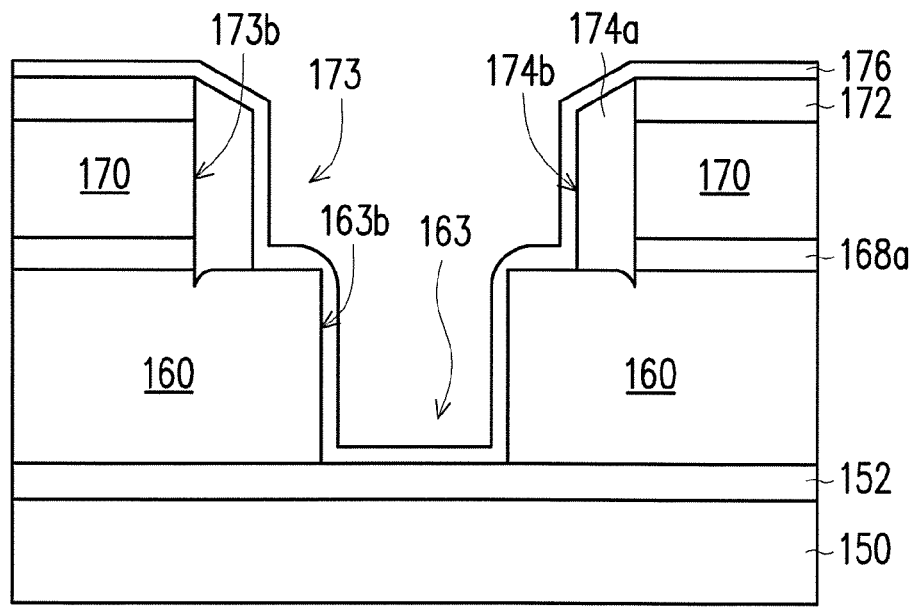

In FIG. 2H, in some embodiments, a conformal adhesion layer 176 is formed on the second resist pattern 172 and the second inter-dielectric layer 170 and over the trench opening 173 and the via opening 163. In some embodiment, the adhesion layer 176 conformally covers the sidewalls 174b of the remained barrier layer 174a, the sidewalls 163b of the via opening 163 and the exposed liner layer 152. In certain embodiments, the adhesion layer 176 is formed with good conformity and step coverage, and the adhesion layer 176 is formed by atomic layer deposition (ALD) or plasma-enhanced ALD (PEALD). In certain embodiments, the adhesion layer 176 is conformal to the profile of the via opening 163 and covers the sidewalls 174b of the remained barrier layer 174a and the liner layer 152. In certain embodiments, the adhesion layer 176 comprises a single layer or a multi-layered structure and functions as the adhesion layer and diffusion barrier layer. In one embodiment, the material of the adhesion layer 176 includes silicon nitride, silicon oxynitride, silicon carbonitride (SiCN), silicon carbon oxynitride (SiCON), tantalum nitride, titanium nitride or combinations thereof.

Figure 2I:
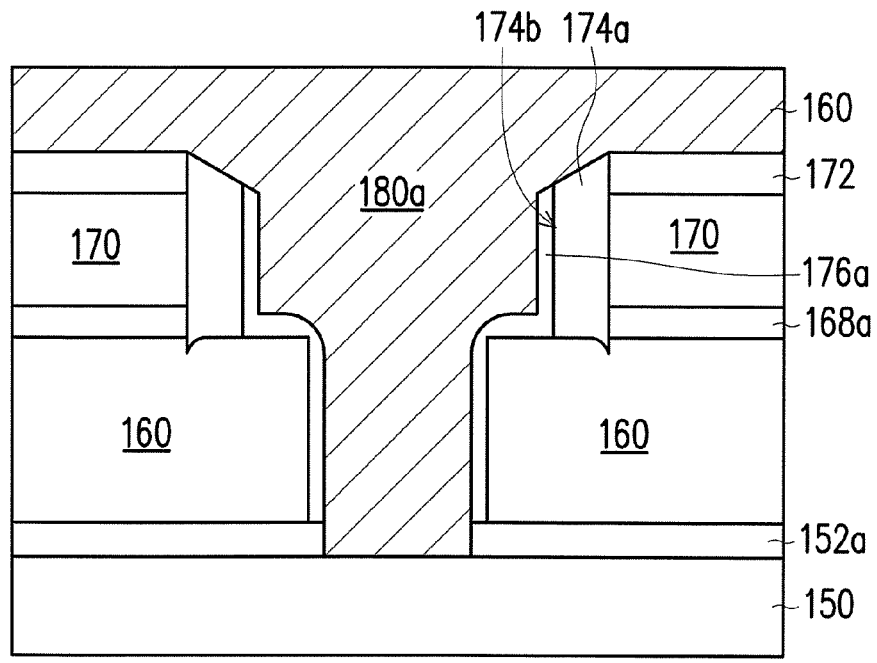

In FIG. 2I, in some embodiments, the adhesion layer 176 is partially removed to form the remained adhesion layer 176a and the liner layer 152 exposed by the via opening 163 is removed to form the remained liner layer 152a. In certain embodiments, the remained adhesion layer 176a is located on and covers the sidewalls 174b of the remained barrier layer 174a and the sidewalls 163b of the via opening 163. In certain embodiments, the adhesion layer 176 and the liner layer 152 are partially removed by performing one or more anisotropic etching processes to remove the adhesion layer 176 located on the second resist pattern 172 and to etch through the adhesion layer 176 and the liner layer 152 at the bottom, so that the conductive region 150 is exposed. With the presence of the adhesion layer 176, the etching of the liner layer 152 is well controlled without damaging the first or second inter-dielectric layers, leading to the larger process window for etching through the liner layer 152 and controlled opening profiles. Later, as shown in FIG. 2I, in some embodiments, a metal material 180 is formed over the second inter-dielectric layer 170 and the second resist pattern 172 and fills the trench opening 173 and the via opening 163. The metal material 180, in certain embodiments, covers the remained adhesion layer 176a and covers the exposed conductive region 150. The metal material 180 includes copper, tungsten or alloys thereof, for example. In some embodiments, the metal material 180 is formed by CVD, PVD or electrochemical plating.

Figure 2J:
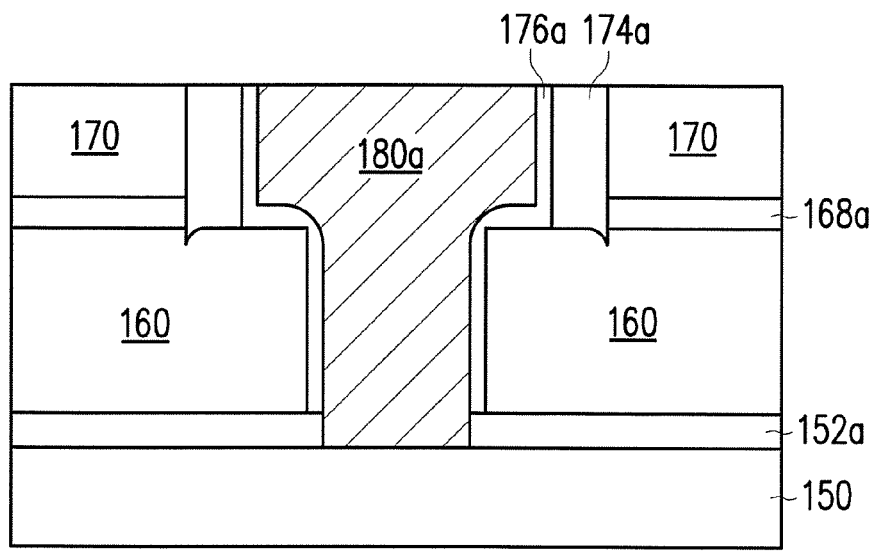

In FIG. 2J, in some embodiments, the second resist pattern 172 and the extra metal material 180 above the second inter-dielectric layer 170 are removed by performing a planarization process to form a metal interconnect 180a that is disposed on the conductive region 150 and is surrounded by the remained adhesion layer 176a. The metal interconnect 180a penetrating through the liner layer 152 contacts with the conductive region 150. In certain embodiments, the metal interconnect 180a contacts with the conductive region 150. In one embodiment, the planarization process includes a chemical metal polishing (CMP) process.

Figure 2K:
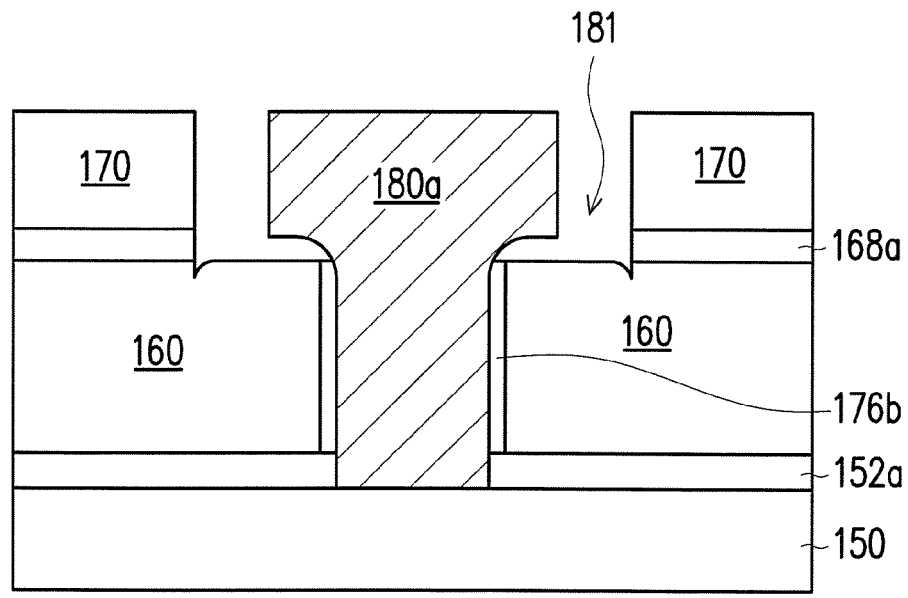

In FIG. 2K, in some embodiments, the remained barrier layer 174a and the remained adhesion layer 176a above the first inter-dielectric layer 160 are removed to form the gap (air gap) 181 and the adhesion sheath structure 176b. The gap 181 is located between the metal interconnect 180a and the second inter-dielectric layer 170 and surrounding the upper portion of the metal interconnect 180a. The adhesion sheath structure 176b is located between the metal interconnect 180a and the first inter-dielectric layer 160 and surrounds the lower portion of the metal interconnect 180a. In certain embodiments, the removal of the remained barrier layer 174a and the remained adhesion layer 176a above the first inter-dielectric layer 160 includes performing one or more etching processes, including isotropic etching, anisotropic etching or the combination thereof. Upon the removal of the remained barrier layer 174a, the resultant gap 181 isolates the exposed encroachment from the metal interconnect 180a, further improving the yield and the performance. Also, the gap 181 lowers the dielectric constant for the whole interconnect structure.

Figure 2L:
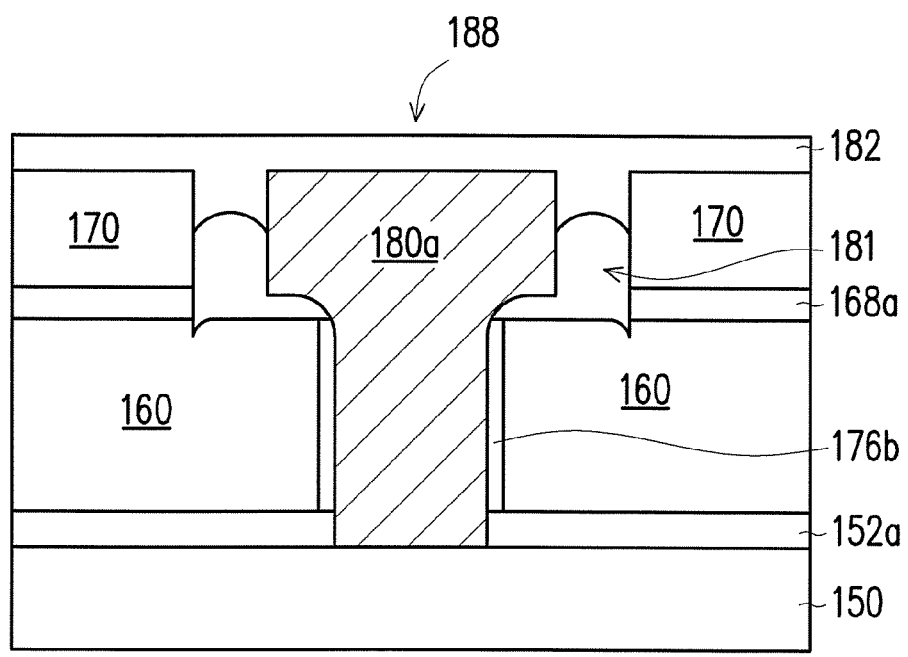

In FIG. 2L, a cap layer 182 is formed over the second inter-dielectric layer 170 and the metal interconnect 180a and covers the gap 181, thus completing the interconnect structure 188. In certain embodiment, the cap layer 182 may function as an etching stop layer for the subsequent processes and the material of the cap layer 182 includes nitride. In some embodiments, the cap layer 182 covers the air gap 181 without filling up the gap 181, and the metal interconnect 180a is air-gap insulated by the remaining air gap 181 surrounding the metal interconnect 180a. The interconnect structure 188 at least includes the metal interconnect 180a and the adhesion sheath structure 176b. In addition, the gap 181 isolating the metal interconnect 180a from the inter-dielectric layers 160/170 and the cap layer 182 may be considered part of the interconnect structure 188.

In the above embodiments, due to the existence of the stop layer 168, the process window for forming the trench opening 173 becomes larger. In addition, the formation of the barrier layer 174 and the adhesion layer 176 contributes to the better control for the critical dimension of the trench/via opening(s). The gap located between the cap layer, the stop layer and the second inter-dielectric layer surrounds the metal interconnect and isolates the metal interconnect from the second inter-dielectric layer, thus offering lower resistance for the interconnect structure and improving the reliability by suppressing the tiger teeth issue.

The formation of the gap(s) 181 within the semiconductor device lowers the contact resistance and delivers desired performance without tiger teeth issues. For the devices with a narrow spacing, it is possible to further decrease the size or dimension of the interconnect structure without compromising the reliability of the interconnect structure. Thus, the interconnect structure and the FET device having the interconnect structure therein in accordance with the above embodiments of the present disclosure offers lower contact resistance, improved reliability and better performance.

Figure 3:
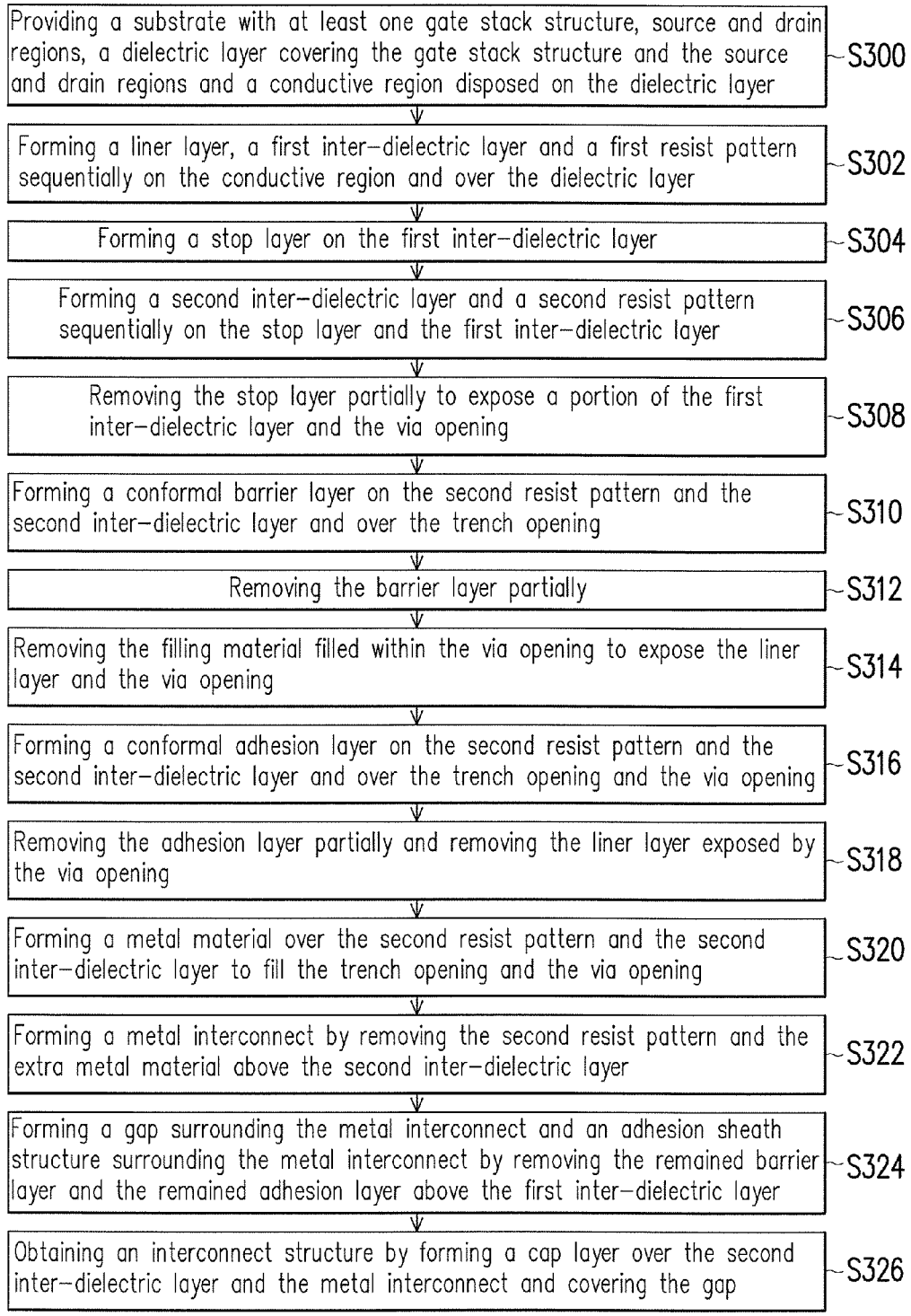
FIG. 3 is an exemplary flow chart showing the process steps of the manufacturing method for forming a FET device in accordance with some embodiments of the present disclosure.

FIG. 3 is an exemplary flow chart showing some of the process steps of the manufacturing method for forming a FET in accordance with some embodiments of the present disclosure.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In Step 300, a substrate with at least one gate stack structure, source and drain regions, a dielectric layer covering the gate stack structure and the source and drain regions and a conductive region disposed on the dielectric layer is provided. The substrate is a silicon substrate or a silicon-on-insulator (SOI) substrate. In Step 302, a liner layer, a first inter-dielectric layer and a first resist pattern are sequentially formed on the conductive region and over the dielectric layer. In some embodiments, the first inter-dielectric layer includes a via opening exposing the liner layer and a filling material fills up the via opening. In Step 304, a stop layer is formed on the first inter-dielectric layer. In Step 306, a second inter-dielectric layer and a second resist pattern are sequentially formed on the stop layer and the first inter-dielectric layer. In certain embodiments, the second inter-dielectric layer includes a trench opening exposing the stop layer. In Step 308, the stop layer is partially removed to expose a portion of the first inter-dielectric layer and the via opening. In some embodiments, the remained stop layer is located between the first and second inter-dielectric layers. In Step 310, a conformal barrier layer is formed on the second resist pattern and the second inter-dielectric layer and over the trench opening. In Step 312, the barrier layer is partially removed. In some embodiments, the remained barrier layer covers the sidewalls of the trench opening. In Step 314, the filling material filled within the via opening is removed and the liner layer and the via opening are exposed. In Step 316, a conformal adhesion layer is formed on the second resist pattern and the second inter-dielectric layer and over the trench opening and the via opening. In Step 318, the adhesion layer is partially removed and the liner layer exposed by the via opening is removed. In some embodiments, the remained adhesion layer covers the sidewalls of the via opening and the remained barrier layer. In Step 320, a metal material is formed over the second resist pattern and the second inter-dielectric layer and fills the trench opening and the via opening. In Step 322, a metal interconnect is formed by removing the second resist pattern and the extra metal material above the second inter-dielectric layer. In Step 324, a gap surrounding the metal interconnect and an adhesion sheath structure surrounding the metal interconnect are formed by removing the remained barrier layer and the remained adhesion layer above the first inter-dielectric layer. In Step 326, an interconnect structure is obtained by forming a cap layer over the second inter-dielectric layer and the metal interconnect and covering the gap.

In the above embodiments, the etching profile of the via opening or the trench opening can be well controlled through the formation of the stop layer, the barrier layer and the adhesion layer, and the process window for forming the via opening or trench opening becomes larger due to the existence of the liner layer and the stop layer. For the device having the gate structures arranged with tight pitch or spacing, the formation of the barrier layer and/or the adhesion layer further decreases the size or dimension of the interconnect structure without compromising the reliability of the interconnect structure. Also, the gap resulted from the removal of the barrier layer and the adhesion layer contributes to lower the contact resistance for the whole interconnect structure and the electrical performance of the device is boosted.

In some embodiments of the present disclosure, a field effect transistor device is described. The field effect transistor device comprises a substrate with at least one gate stack structure thereon and source and drain regions disposed at opposite sides of the at least one gate stack structure. A dielectric layer is disposed over the substrate and covering the at least one gate stack structure and the source and drain regions. A conductive region is disposed over the dielectric layer and an inter-dielectric layer is disposed on the conductive region. The field effect transistor device comprises an interconnect structure disposed within the inter-dielectric layer and disposed on the conductive region. The interconnect structure comprises a metal interconnect disposed on the conductive region, an adhesion sheath structure and a cap layer. The adhesion sheath structure is disposed between the metal interconnect and the inter-dielectric layer and surrounds the metal interconnect. The cap layer is disposed on the metal interconnect and covers a gap between the metal interconnect and the inter-dielectric layer.

In some embodiments of the present disclosure, a field effect transistor device is described. The field effect transistor device comprises a substrate, at least one gate stack structure disposed on the substrate and source and drain regions disposed at opposite sides of the at least one gate stack structure. A dielectric layer is disposed over the substrate and covers the at least one gate stack structure and the source and drain regions. A conductive region is disposed on the dielectric layer. A first inter-dielectric layer is disposed on the conductive region, and the first inter-dielectric layer comprises a via opening. A stop layer is disposed on the first inter-dielectric layer. A second inter-dielectric layer is disposed on the stop layer, and the second inter-dielectric layer comprises a trench opening. The field effect transistor device comprises an interconnect structure disposed within the first inter-dielectric layer and the second inter-dielectric layer and disposed on the conductive region. The interconnect structure comprises a metal interconnect, an adhesion sheath structure and a cap layer. The metal interconnect is disposed within the via opening of the first inter-dielectric layer and the trench opening of the second inter-dielectric layer and disposed on the conductive region. The adhesion sheath structure is disposed within the via opening and between the first inter-dielectric layer and the metal interconnect, and the adhesion sheath structure surrounds the metal interconnect located within the via opening. The cap layer is disposed on the metal interconnect and covers the second inter-dielectric layer and a gap between the metal interconnect and the second inter-dielectric layer.

In some embodiments of the present disclosure, a method for forming a field effect transistor device is described. A substrate with at least one gate stack structure, source and drain regions, a dielectric layer covering the gate stack structure and the source and drain regions and a conductive region disposed on the dielectric layer is provided. A liner layer, a first inter-dielectric layer and a first resist pattern are sequentially formed on the conductive region and over the dielectric layer. The first inter-dielectric layer includes a via opening exposing the liner layer and a filling material fills up the via opening. A stop layer is formed on the first inter-dielectric layer. A second inter-dielectric layer and a second resist pattern are sequentially formed on the stop layer and the first inter-dielectric layer. The second inter-dielectric layer includes a trench opening exposing the stop layer. The stop layer is partially removed to expose a portion of the first inter-dielectric layer and the via opening. A conformal barrier layer is formed on the second resist pattern and the second inter-dielectric layer and over the trench opening. The barrier layer is partially removed and the remained barrier layer covers the sidewalls of the trench opening. The filling material filled within the via opening is removed and the liner layer and the via opening are exposed. A conformal adhesion layer is formed on the second resist pattern and the second inter-dielectric layer and over the trench opening and the via opening. The adhesion layer is partially removed and the liner layer exposed by the via opening is removed. A metal material is formed over the second resist pattern and the second inter-dielectric layer and fills the trench opening and the via opening. A metal interconnect is formed by removing the second resist pattern and the extra metal material above the second inter-dielectric layer. A gap surrounding the metal interconnect and an adhesion sheath structure surrounding the metal interconnect are formed by removing the remained barrier layer and the remained adhesion layer above the first inter-dielectric layer. An interconnect structure is obtained by forming a cap layer over the second inter-dielectric layer and the metal interconnect and covering the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor device, comprising:
   a substrate with at least one gate stack structure thereon and source and drain regions disposed at opposite sides of the at least one gate stack structure;
   a dielectric layer, disposed over the substrate and covering the at least one gate stack structure and the source and drain regions;
   a conductive region, disposed over the dielectric layer;
   an inter-dielectric layer disposed on the conductive region; and
   an interconnect structure, disposed within the inter-dielectric layer and disposed on the conductive region, wherein the interconnect structure comprises:
     a metal interconnect, disposed on the conductive region;
     an adhesion sheath structure, disposed between the metal interconnect and the inter-dielectric layer and surrounding the metal interconnect; and
     a cap layer disposed on the metal interconnect and covering a gap between the metal interconnect and the inter-dielectric layer, wherein the gap exposes a portion of a surface of the metal interconnect that is not covered by the adhesion sheath structure.

2. The field effect transistor device of claim 1, wherein the inter-dielectric layer comprises a stop layer embedded within the inter-dielectric layer.

3. The field effect transistor device of claim 1, wherein the inter-dielectric layer comprises a first inter-dielectric layer disposed on the conductive region, a stop layer disposed on the first inter-dielectric layer and a second inter-dielectric layer disposed on the stop layer, and the adhesion sheath structure is disposed between the first inter-dielectric layer and the metal interconnect.

4. The field effect transistor device of claim 1, further comprising a liner layer disposed on the conductive region and between the inter-dielectric layer and the conductive region, wherein the metal interconnect penetrating through the liner layer contacts with the conductive region.

5. The field effect transistor device of claim 1, further comprising a connector in contact with the conductive region and electrically connected to the source and drain regions.

6. The field effect transistor device of claim 1, wherein a material of the adhesion sheath structure comprises silicon nitride, silicon oxynitride, silicon carbonitride (SiCN), silicon carbon oxynitride (SiCON), tantalum nitride, titanium nitride or a combination thereof, and a material of the metal interconnect comprises copper, tungsten or alloys thereof.

7. A field effect transistor device, comprising:
   a substrate;
   at least one gate stack structure, disposed on the substrate;
   source and drain regions, disposed at opposite sides of the at least one gate stack structure;
   a dielectric layer, disposed over the substrate and covering the at least one gate stack structure and the source and drain regions;
   a conductive region, disposed on the dielectric layer;
   a first inter-dielectric layer disposed on the conductive region, wherein the first inter-dielectric layer comprises a via opening;
   a stop layer disposed on the first inter-dielectric layer;
   a second inter-dielectric layer disposed on the stop layer, wherein the second inter-dielectric layer comprises a trench opening; and
   an interconnect structure, disposed within the first inter-dielectric layer and the second inter-dielectric layer and disposed on the conductive region, wherein the interconnect structure comprises:
     a metal interconnect, disposed within the via opening of the first inter-dielectric layer and the trench opening of the second inter-dielectric layer and disposed on the conductive region;
     an adhesion sheath structure, disposed within the via opening and between the first inter-dielectric layer and the metal interconnect, wherein the adhesion sheath structure surrounds the metal interconnect located within the via opening; and
     a cap layer disposed on the metal interconnect and covering the second inter-dielectric layer and a gap between the metal interconnect and the second inter-dielectric layer, wherein a portion of a surface of the metal interconnect is exposed by the gap that is located above the first inter-dielectric layer.

8. The field effect transistor device of claim 7, wherein the gap located between the cap layer, the stop layer and the second inter-dielectric layer surrounds the metal interconnect and isolates the metal interconnect from the second inter-dielectric layer.

9. The field effect transistor device of claim 7, further comprising a liner layer disposed on the conductive region and between the first inter-dielectric layer and the conductive region, wherein the metal interconnect penetrating through the liner layer contacts with the conductive region.

10. The field effect transistor device of claim 7, further comprising a connector in contact with the conductive region and electrically connected to the source and drain regions.

11. The field effect transistor device of claim 7, wherein a material of the adhesion sheath structure comprises silicon nitride, silicon oxynitride, silicon carbonitride (SiCN), silicon carbon oxynitride (SiCON), tantalum nitride, titanium nitride or a combination thereof, and a material of the metal interconnect comprises copper, tungsten or alloys thereof.

12. A method for forming a field effect transistor device, comprising:
    providing a substrate with a gate stack structure, source and drain regions, a dielectric layer covering the gate stack structure and the source and drain regions and a conductive region disposed on the dielectric layer;
    forming a liner layer, a first inter-dielectric layer and a first resist pattern sequentially on the conductive region and over the dielectric layer, wherein the first inter-dielectric layer comprises a via opening filled with a filling material;
    forming a stop layer on the first inter-dielectric layer;
    forming a second inter-dielectric layer and a second resist pattern sequentially on the stop layer and the first inter-dielectric layer, wherein the second inter-dielectric layer comprises a trench opening;
    removing the stop layer partially to expose a portion of the first inter-dielectric layer and the via opening;
    forming a conformal barrier layer on the second resist pattern and the second inter-dielectric layer and over the trench opening;
    removing the barrier layer partially;
    removing the filling material filled within the via opening to expose the liner layer and the via opening;
    forming a conformal adhesion layer on the second resist pattern and the second inter-dielectric layer and over the trench opening and the via opening;
    removing the adhesion layer partially and removing the liner layer exposed by the via opening;
    forming a metal material over the second resist pattern and the second inter-dielectric layer to fill the trench opening and the via opening;
    forming a metal interconnect by removing the second resist pattern and the extra metal material above the second inter-dielectric layer;
    forming a gap surrounding the metal interconnect and exposing partially a surface of the metal interconnect, and forming an adhesion sheath structure surrounding the metal interconnect by removing the remained barrier layer and the remained adhesion layer above the first inter-dielectric layer; and
    forming an interconnect structure by forming a cap layer over the second inter-dielectric layer and the metal interconnect and covering the gap.

13. The method of claim 12, wherein forming a liner layer, a first inter-dielectric layer and a first resist pattern sequentially on the conductive region and over the dielectric layer comprises patterning the first inter-dielectric layer using the first resist pattern as a mask to form the via opening and forming the filling material into the via opening.

14. The method of claim 13, wherein forming a second inter-dielectric layer and a second resist pattern sequentially on the stop layer and the first inter-dielectric layer comprises patterning the second inter-dielectric layer using the second resist pattern as a mask to form the trench opening exposing the stop layer.

15. The method of claim 13, wherein forming a conformal barrier layer comprises performing an atomic layer deposition (ALD) process and a material of the barrier layer comprises silicon nitride, silicon oxynitride, silicon carbonitride (SiCN) or a combination thereof.

16. The method of claim 13, wherein forming a conformal adhesion layer comprises performing an atomic layer deposition (ALD) process or a plasma-enhanced ALD (PEALD) process, and a material of the adhesion layer comprises silicon nitride, silicon oxynitride, silicon carbonitride (SiCN), silicon carbon oxynitride (SiCON), tantalum nitride, titanium nitride or combinations thereof.

17. The method of claim 12, wherein removing the barrier layer partially comprises removing the barrier layer located on the first and second inter-dielectric layers to leave the remained barrier layer covering sidewalls of the trench opening.

18. The method of claim 12, wherein removing the adhesion layer partially and removing the liner layer exposed by the via opening comprises performing at least one anisotropic etching process to remove the adhesion layer located on the second resist pattern and etch through the adhesion layer and the liner layer to expose the conductive region.

19. The method of claim 16, wherein forming a metal interconnect comprises performing a planarization process to remove the second resist pattern and the extra metal material above the second inter-dielectric layer.

20. The method of claim 12, wherein the metal material includes copper, tungsten or alloys thereof, and the metal material is formed by chemical vapor deposition (CVD), physical vapor deposition (PVD) or electrochemical plating.

* * * * *